United States Patent

Altonen, Jr. et al.

[15] 3,638,071

[45] Jan. 25, 1972

[54] SHORTING DEVICE

[72] Inventors: Wilhart Niilo Altonen, Jr., Cupertino, Calif.; Fred Vincent Auer, Phoenix, Ariz.

[73] Assignee: Motorola, Inc., Franklin Park, Ill.

[22] Filed: Dec. 31, 1970

[21] Appl. No.: 103,052

[52] U.S. Cl. ....317/2 R, 102/28 S, 317/16, 317/33 R, 339/19

[51] Int. Cl. ....H05f 3/04

[58] Field of Search ....317/2, 16, 31, 33, 235; 174/51, 99; 307/304; 339/17, 19, 65; 29/193.5; 102/70.2, 28 S

[56] References Cited

UNITED STATES PATENTS

| | | | |
|---|---|---|---|
| 3,516,044 | 6/1970 | Barnes et al. | 317/234 |
| 3,413,497 | 11/1968 | Atalla | 317/2 R |
| 2,760,128 | 8/1956 | Colky | 339/19 X |
| 1,606,414 | 11/1926 | Grant | 102/28 S |

FOREIGN PATENTS OR APPLICATIONS

| | | | |
|---|---|---|---|
| 849,078 | 9/1958 | Great Britain | 339/19 |

*Primary Examiner*—J. D. Miller
*Assistant Examiner*—Harry E. Moose, Jr.
*Attorney*—Mueller and Aichele

[57] ABSTRACT

There is disclosed a unitary conducting planar shorting member for use in transporting semiconductor devices such that all the leads from the semiconductor device are provided with an equipotential plane so as to eliminate damage from static electricity. The shorting member is in the form of a circle notched at its periphery, the notches corresponding in position to the position of the leads from the semiconductor device. The notched-circle portion is also provided with a handle portion and a guide portion disposed on an opposite side of the circle from the handle portion.

10 Claims, 3 Drawing Figures

INVENTOR.
Wilhart Niilo Altonen Jr.
BY Fred Vincent Auer
Mueller & Aichele
ATTY'S.

SHORTING DEVICE

BACKGROUND

This invention relates to shorting devices and more particularly to a planar metal shorting member used to short the terminal leads from a semiconductor device during shipment of the device.

Static electricity is a problem in the transport of semiconductor devices and in particular metal oxide semiconductors. If these devices should happen to have a static potential applied across certain terminal leads, the static electricity could damage the junction that these leads are attached to. The static electricity may be only that picked up by walking on a carpet on a dry day or could be generated by the transporting vehicle itself. This problem is solved generally by shorting out all pins or connector leads on a semiconductor device during shipping. Because of the volume of semiconductor devices shipped this shorting becomes a problem, not only because of the expense but also because of the time necessary to provide an equipotential plane at the collector leads.

This problem is solved by the subject invention by providing an inexpensive stamped metal member having a peripherally notched area integrally connected to a handle portion and a guide portion located on the opposite side of the notched portion from that of the handle.

This shorting member is put in position prior to shipping so as to protect the semiconductor device. In general, when transistors are shipped, they are placed in a lead straightening and holding device commonly called a receptacle. The purpose of this device is to insure that the leads remain straight and untangled. The subject shorting member is inserted between the leads from the semiconductor device after the semiconductor device is partially inserted into the receptacle. In order to position the shorting member it must first be inserted between the leads and then rotated so that the plane of the shorting member lies parallel to the face of the receptacle. In this manner it is positioned such that the peripheral portion contacts the leads at the notched portions applying a slight pressure thereat. The semiconductor is then further inserted into the receptacle so as to provide a mechanically stable package and so as to prevent the member from coming out during transit.

SUMMARY OF THE INVENTION

It is therefore an object of this invention to provide a planar metallized shorting member for use in the transportation of semiconductor devices.

It is another object of this invention to provide a metallic shorting member having a notched peripheral configuration and further including a handle portion and a guide portion integral therewith such that the shorting member can be easily maneuvered into position.

It is a further object of this invention to provide an improved method of transporting semiconductor devices involving the combination of a semiconductor device having leads projecting downwardly therefrom, a shorting member adapted to contact these leads at the periphery thereof and a storage receptacle having bores therethrough to accommodate the aforementioned leads.

Other objects of this invention will be better understood upon reading the following description of the following drawings.

BRIEF DESCRIPTION OF THE INVENTION

This invention relates generally to a planar unitary shorting member inserted between the base of a transistor and the receptacle on top of which the semiconductor device is transported. The purpose of this shorting member is to provide an equipotential plane adjacent the leads from the semiconductor device so as to protect the semiconductor device from ambient static electricity. The shape of the shorting member conforms to the area inside a region bounded by the leads from the semiconductor device such that the shorting member is said to lie interior to these leads, with the exception of the handle and guide portions. The shorting member is peripherally notched at the points of contact with the leads.

DETAILED DESCRIPTION OF THE INVENTION

As mentioned hereinbefore, semiconductor devices must be protected from static electricity during transport. If the potential due to static electric charge is disposed across a semiconductor junction in the wrong direction it may very well damage the junction such that the semiconductor device is no longer usable. If an equipotential plane is established at the leads of this device any static electricity will be distributed evenly across any junctions. Therefore, no damage will occur to a junction in the device when a potential is applied to one lead from the junction and a lead on the other side of the junction is grounded.

Shorting devices have been devised in the past which have been very complicated and expensive, generally including a multiplicity of parts or parts lying not in the same plane. In addition these devices have not been provided with handle portions such that they may easily be placed in the appropriate position. Because of the hundreds of thousands of semiconductor devices which must be shipped weekly, the cost of any shorting device used must be taken into account when compared with the number of transistor devices that could be damaged by static electricity. It turns out that only the least expensive of these shorting devices can be used economically in the volumes anticipated.

Figure 1:
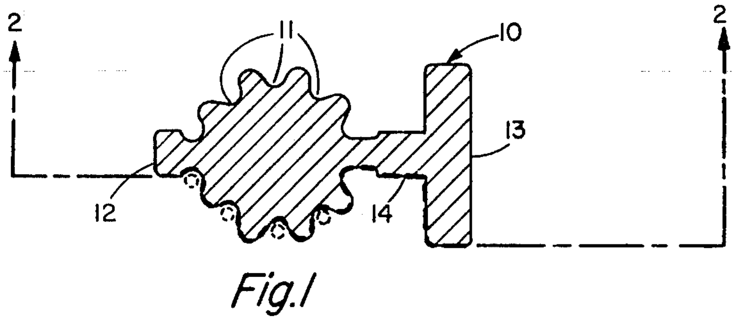
FIG. 1 is a top view of the subject shorting member showing a peripherally notched structure in combination with integrally formed guide and handle portions.

An inexpensive shorting device is shown in FIG. 1 at numeral 10, to be composed of a unitary flat section of metal having a notched peripheral portion 11, a handle portion 13 which does not interfere with the notches and a guide portion 12 which is useful but not necessary. This entire section may be stamped from sheet metal in a single, inexpensive operation to form the above-mentioned member. As will be seen from FIG. 1, the notches correspond in position exactly to the position of the leads of the semiconductor device to prevent relative movement between the section and the leads. Alternately the periphery need not be notched so long as contact is made with the leads. It will be appreciated that this peripheral portion lies interior to the leads and may take on any shape or configuration depending on the configuration and position of the leads themselves. In the preferred embodiment a circularly formed peripherally notched portion may be used although this invention is not limited to a circular notched configuration. It will further be appreciated that the truck of the T handle section 13, shown at 14, is far enough removed from the engaging portion or notch portion 11 that is does not interfere with the shorting of the semiconductor leads.

This entire stamped metal member may be made from cold-rolled steel which is cadmium plated or plated with some other conductive material to prevent the formation of rust. Alternately, any metal, including stainless steel, may be stamped in the desired configuration.

Figures 2, 3:
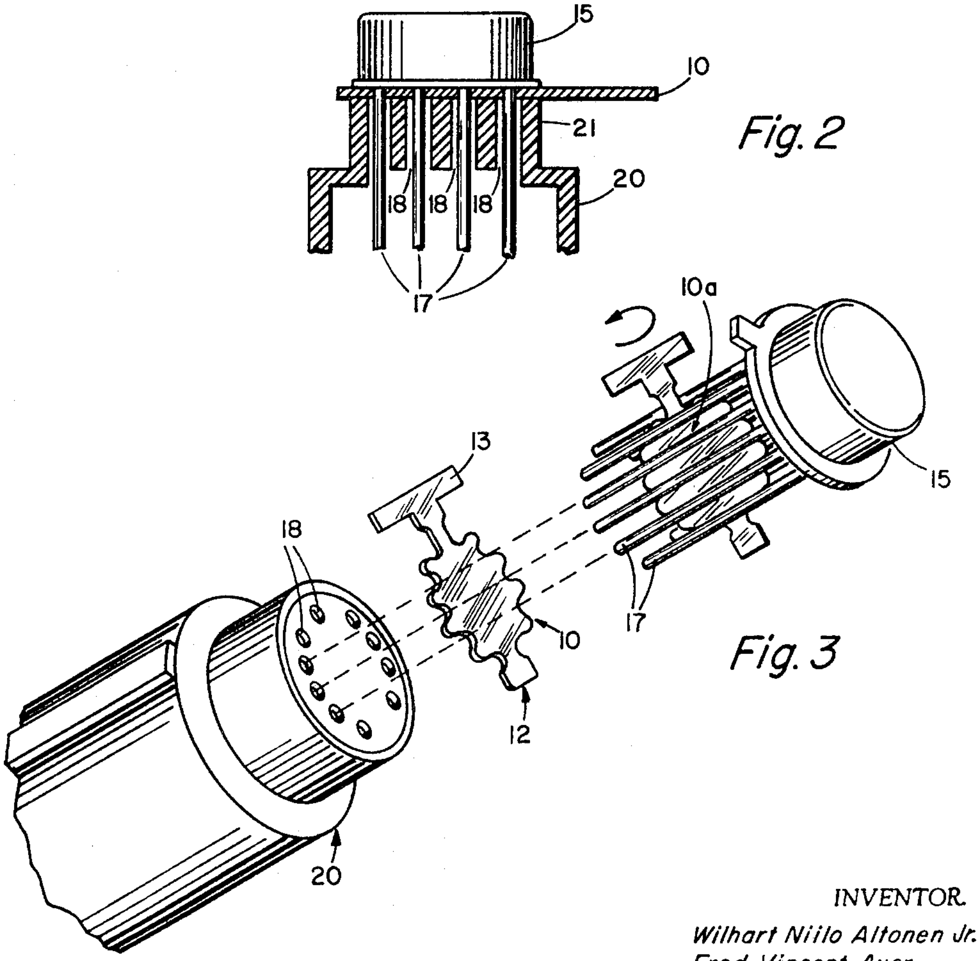
FIG. 2 is a cross-sectional diagram of a transistor mounted within a receptacle and having the shorting member intermediate between the base of the transistor and the top portion of the receptacle.
FIG. 3 is an exploded view of the transistor, shorting member, receptacle combination indicating the insertion and rotation of the shorting member.

Referring to FIG. 2, a semiconductor device 15 is shown inserted into a receptacle 20 having bores 18 through a top portion 21. The purpose of these bores is to maintain the spacing of the semiconductor leads, shown at 17, and may be as deep as necessary to preserve the straightness of the leads. Interposed between the bottom portion of the transistor 15 and top portion 21 of the receptacle, is shorting member 10. The view shown in FIG. 2 is taken along line 2—2 of FIG. 1. As can be seen in this drawing, body portion 20 extends outwardly so as to protect those portions of the leads which are not housed within bores 18, Again top portion 21 of the receptacle is bored in positions which register with the positions of the leads of the proposed semiconductor device.

The registration of the conductor leads 17, shorting member 10 and the bores 18 in receptacle 20 is shown in exploded view at FIG. 3. In practice, in the preferred embodiment, leads 17 are partially inserted in bores 18 prior to the insertion of shorting member 10. After transistor 15 is partially in place, clip 10 is turned such that the plane of the member is perpendicular to both the bottom portion of transistor 15 and the top portion of receptacle 20. This is shown at 10*a*. The member is then inserted in between the downwardly projecting leads until the shorting portion is interior to the leads. Shorting member 10 is then turned by handle portion 13 such that the plane of the shorting member is parallel to the face of the receptacle and the bottom of the semiconductor device such that notches cut into member 10 register with, are aligned with and contact leads 17. Thereafter, semiconductor device 15 is pushed towards the surface of receptacle 20 until there is a contact made between the rim portion of the base of semiconductor device 15, shorting member 10 and the rim portion of receptacle 20.

It will be appreciated that shorting member 10 may be used with or without receptacle 20 since its function is to quickly and economically short the leads of a semiconductor device. Normally, however, the semiconductor device is shipped in a receptacle and the shorting member placed between the semiconductor device and the receptacle as shown either in FIG. 2 or FIG. 3.

It will be appreciated that in the insertion-type method described above, guide portion 12 of the member is useful in the alignment of the member with respect to the leads 17. It is however, not a necessary portion of the invention.

With the subject shorting member it is possible to transport large numbers of semiconductor devices and to protect them from accidental damage due to the buildup of static electric charge. The shorting member is easily insertable into already-existing transporting receptacles so that no alteration is necessary of standard transporting apparatus.

What is claimed is:

1. Apparatus for establishing an equipotential electric plane at the leads from a semiconductor device during transportation thereof so as to protect said device from the application of static electricity across said leads comprising:

a unitary planar electrically conducting member having a periphery notched so as to correspond in position to the location of said leads, said member including a handle portion integrally formed therewith and lying in the same plane as said electrically conducting member, said handle portion extending from said electrically conducting member between adjacent peripheral notches, whereby whenever said conducting member is positioned so as to contact said leads, said device is protected from the application of static electricity.

2. The apparatus as recited in claim 1 wherein said conducting member is provided with a guide portion integrally formed therewith and extending from said conducting member between adjacent portions on a side of said conducting member opposite said handle portion.

3. The apparatus as recited in claim 1 wherein said handle portion is in the form of a T so as to permit twisting of said conducting member into a position such that the plane of said conducting member is perpendicular to said leads.

4. The apparatus as recited in claim 1 wherein said conducting member is in the form of a circle notched at its periphery, said circle corresponding to the diameter of a circle contacting the outermost portion of the leads from said device in a plane perpendicular to said leads, the depth of said notched portion being less than the diameter of said leads such that when said conducting member is in an operative position, pressure is exerted by said notched portions against said leads.

5. Apparatus for shipping semiconductor devices so as to maintain an equipotential plane at the leads from the base thereof comprising in combination with said device;

a shorting member positioned so as to contact all of said leads, said member comprising;

a unitary planar electrically conducting portion having a periphery notched so as to correspond in position to the location of said leads;

said portion including a handle portion integrally formed therewith and lying in the same plane as said electrically conducting portion, said handle extending from said electrically conducting portion between adjacent peripheral notches, whereby whenever said conducting portion is positioned so as to contact said leads, said device is protected from the application of static electricity; and a receptacle having bores through a planar face portion thereof corresponding in position to the position of said leads about the base of said semiconductor device, said receptacle adapted to receive said leads through said bores and said member adapted to be inserted through said leads in a plane parallel with said leads and to be rotated by said handle portion into a position perpendicular to said leads and parallel to the planar face portion of said receptacle such that contact is made between said notched portions and said leads, the leads of said device thereafter adapted to be fully inserted into said bores until contact is made between said base, said member and said planar face portion, whereby said semiconductor device is protected during transit.

6. The apparatus in claim 5 wherein said handle portion is T-shaped.

7. The apparatus in claim 6 wherein said conducting portion is in a plane closed curve configuration having notches along the outside edge thereof, said curve fashioned so that said notches contact the inner portion of said leads.

8. The apparatus in claim 7 wherein said plane closed curve is circular.

9. The apparatus as recited in claim 8 wherein said member further includes an integral guiding portion extending in the same plane as said conducting portion from said conducting portion between adjacent notched portions on a side opposite to that of said handle portion.

10. Apparatus for establishing an equipotential electric plane between the leads from a semiconductor device during transportation thereof so as to protect said device from the effects of the application of an electrical potential across said leads, comprising:

a unitary planar electrically conducting member having a periphery adapted to contact said leads when said member is positioned interior thereto, said member including a handle portion integrally formed therewith and lying in the same plane as said member, said handle portion adapted to extend from said member between adjacent leads wherever said member is in position, whereby whenever said member is in position, said device is protected from the application of static electricity.

* * * * *